（12） United States Patent
Masaki et al.

(10) Patent No.: US 7,349,524 B2
(45) Date of Patent: Mar. 25, 2008

(54) X-RAY GENERATOR AND EXPOSURE APPARATUS

(75) Inventors: Fumitaro Masaki, Utsunomiya (JP); Akira Miyake, Nasu-gun (JP)

(73) Assignee: Canon Kabushiki Kaisha, Tokyo (JP)

( * ) Notice: Subject to any disclaimer, the term of this patent is extended or adjusted under 35 U.S.C. 154(b) by 263 days.

(21) Appl. No.: 11/246,485

(22) Filed: Oct. 7, 2005

(65) Prior Publication Data
US 2006/0078089 A1    Apr. 13, 2006

(30) Foreign Application Priority Data
Oct. 8, 2004    (JP)    ............................... 2004-295625

(51) Int. Cl.
*G21G 4/00*    (2006.01)
(52) U.S. Cl. ...................... 378/119; 378/34; 250/504 R
(58) Field of Classification Search ................ 378/34, 378/119; 250/504 R, 492.1, 492.2, 493.1
See application file for complete search history.

(56) References Cited

U.S. PATENT DOCUMENTS

| 6,198,793 B1 * | 3/2001 | Schultz et al. ................. 378/34 |
| 6,359,969 B1 | 3/2002 | Shmaenok ................... 378/156 |
| 2004/0257546 A1 * | 12/2004 | Banine ........................ 355/53 |

FOREIGN PATENT DOCUMENTS

| JP | 2002-174700 | 6/2002 |
| JP | 2004-226244 | 8/2004 |

\* cited by examiner

*Primary Examiner*—Jurie Yun
(74) *Attorney, Agent, or Firm*—Morgan & Finnegan, L.L.P.

(57) ABSTRACT

An X-ray generator for generating plasma and X-ray emitted from the plasma includes a unit for generating the plasma, and plural reflection optical systems for introducing the X-ray through different optical paths.

2 Claims, 12 Drawing Sheets

X-RAY GENERATOR AND EXPOSURE APPARATUS

BACKGROUND OF THE INVENTION

The present invention relates to an X-ray generator that generates the X-ray and extreme ultraviolet ("EUV") light, and an exposure apparatus having the same.

In manufacturing such a fine semiconductor device as a semiconductor memory and a logic circuit in photolithography technology, a reduction projection exposure apparatus has been conventionally employed which uses a projection optical system to project a circuit pattern formed on a mask (reticle) onto a wafer, etc. to transfer the circuit pattern. It is also important for the fine processing to use the exposure light having a shorter wavelength, to make uniform the light intensity that Koehler-illuminates the reticle, and to make uniform the effective light source distribution as an angular distribution of the exposure light that illuminates the reticle and the wafer.

The minimum critical dimension to be transferred by the projection exposure apparatus or resolution is proportionate to a wavelength of light used for exposure. Thus, a projection optical apparatus using the EUV light with a wavelength of about 10 nm to about 15 nm much shorter than that of the UV light (referred to as "EUV exposure apparatus" hereinafter) has been developed. The EUV exposure apparatus typically uses a laser plasma light source. It irradiates a laser beam to a target material to generate plasma for use as the EUV light. The EUV exposure apparatus also typically uses a discharge plasma light source that generates the plasma and generates the EUV light by introducing gas to the electrode for discharging. For example, prior art include Japanese Patent Publications, Application Nos. 2002-174700 and 2004-226244.

However, the laser plasma light source generates not only the EUV light but also flying particles called debris from the target material. In addition, the debris is emitted from the supply mechanism that supplies the target material. The debris also spreads from the electrode material in the discharge plasma light source. The debris causes contaminations, damages, and lowered reflectivity of optical elements, making uneven the light intensity and deteriorating the throughput. Accordingly, U.S. Pat. No. 6,359,969 arranges a debris mitigation system between a light emitting point and a mirror so as to remove the debris.

Figure 3:
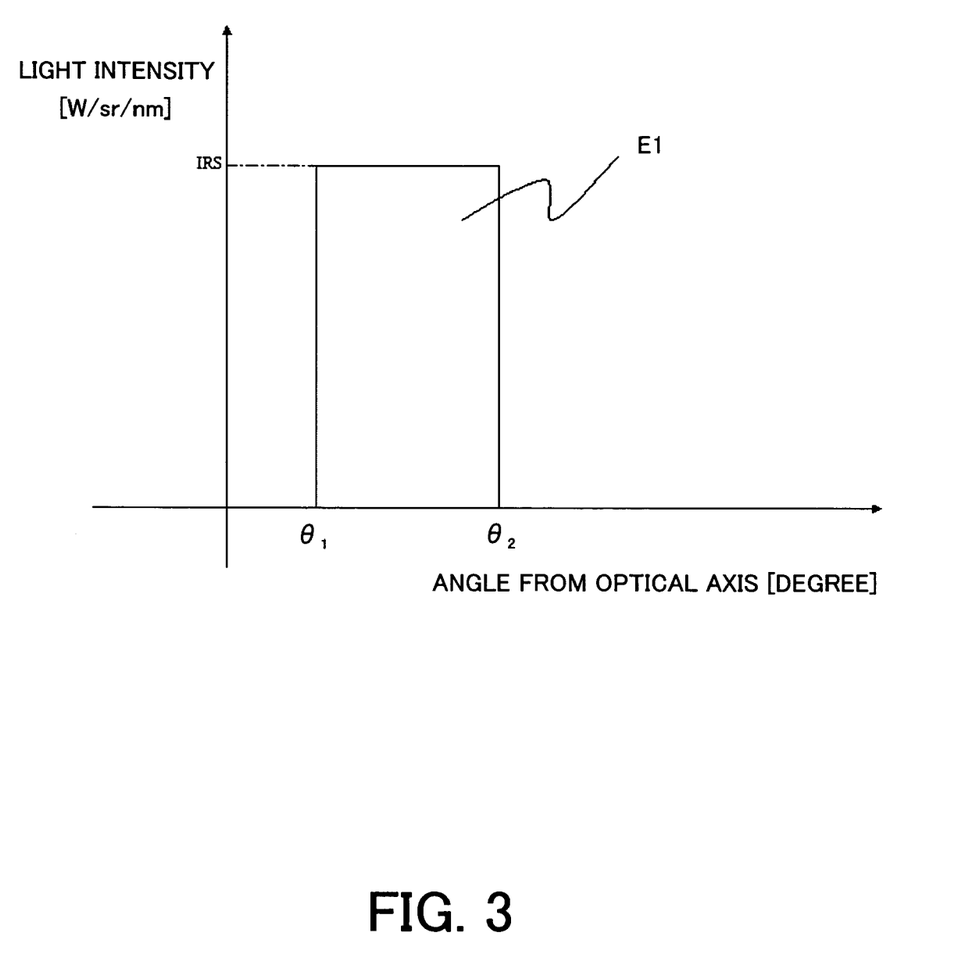
FIG. 3 is a view of a light intensity distribution near the light source outlet in the structure shown in FIG. 2.
Figure 4:
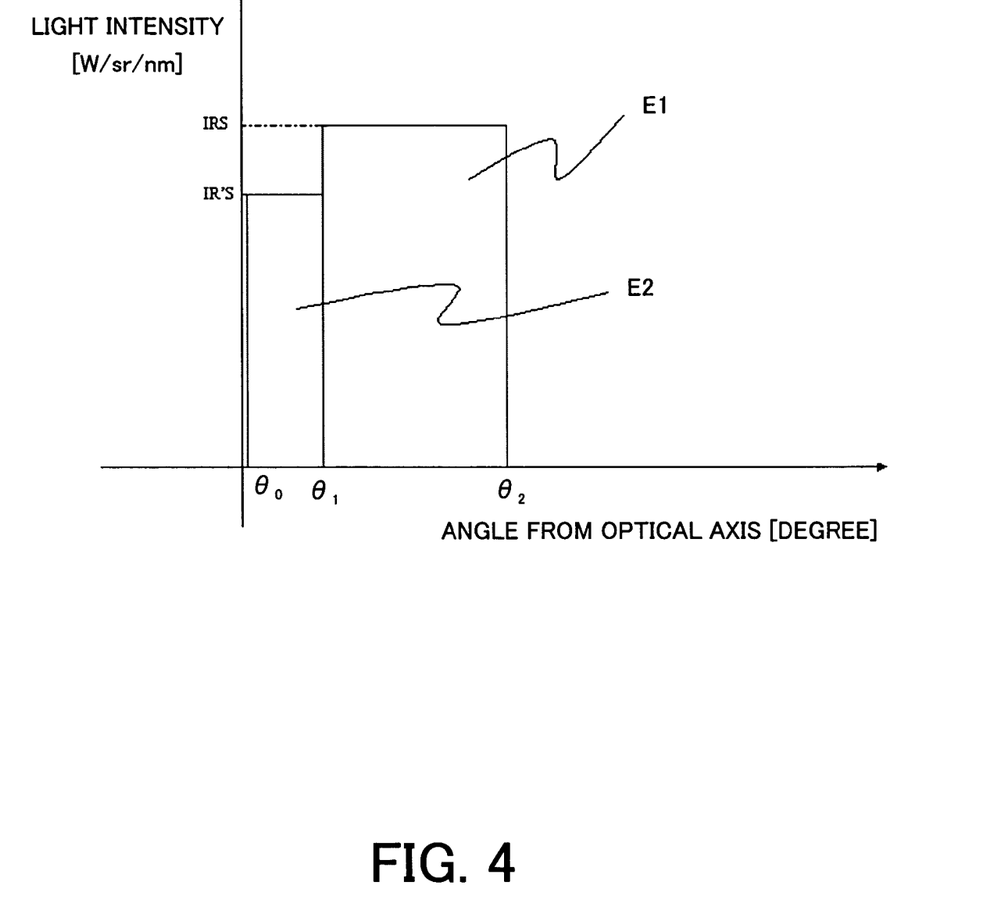
FIG. 4 is a view of a light intensity distribution near the light source outlet in the structure shown in FIG. 1.

The debris mitigation system is designed to remove the debris and transmit the EUV light, but actually it shields part of the EUV light and lowers the light intensity and throughput. In addition, the debris mitigation system shields the EUV light of a certain angle range, makes uneven the angular distribution and lowers the imaging performance. For example, FIG. 3 schematically shows a relationship between the light intensity per unit solid angle and the angle from the optical axis near the light source outlet. E1 is energy taken in by the optical system. The minimum angle $\theta_1$ is determined, as shown in FIG. 4, by an area shielded by the debris mitigation system, and the maximum angle $\theta_2$ is determined by the downstream optical system. Without the debris mitigation system, the minimum angle $\theta_1$ is smaller, and the angular uniformity and the light intensity that depends upon a product between the angle and the light intensity improves, but the mirror would get damaged by the debris.

BRIEF SUMMARY OF THE INVENTION

Accordingly, it is an exemplary object of the present invention to provide an X-ray generator and an exposure apparatus, which improve the uniformity of each of the light intensity and the angular distribution of the exposure light.

An X-ray generator according to one aspect of the present invention for generating plasma and X-ray emitted from the plasma includes a unit for generating the plasma, and plural reflection optical systems for introducing the X-ray through different optical paths.

An exposure apparatus according to another aspect of the present invention includes the above X-ray generator, an illumination optical system for illuminating a reticle having a pattern with X-ray generated by said X-ray generator, and a projection optical system for projecting the pattern of the reticle illuminated by said illumination optical system, onto an object to be exposed.

A device manufacturing method according to still another aspect of the present invention includes the steps of exposing an object using the above exposure apparatus, and developing the object exposed.

Other objects and further features of the present invention will become readily apparent from the following description of the preferred embodiments with reference to accompanying drawings.

DETAILED DESCRIPTION OF THE PREFERRED EMBODIMENTS

Figure 1:
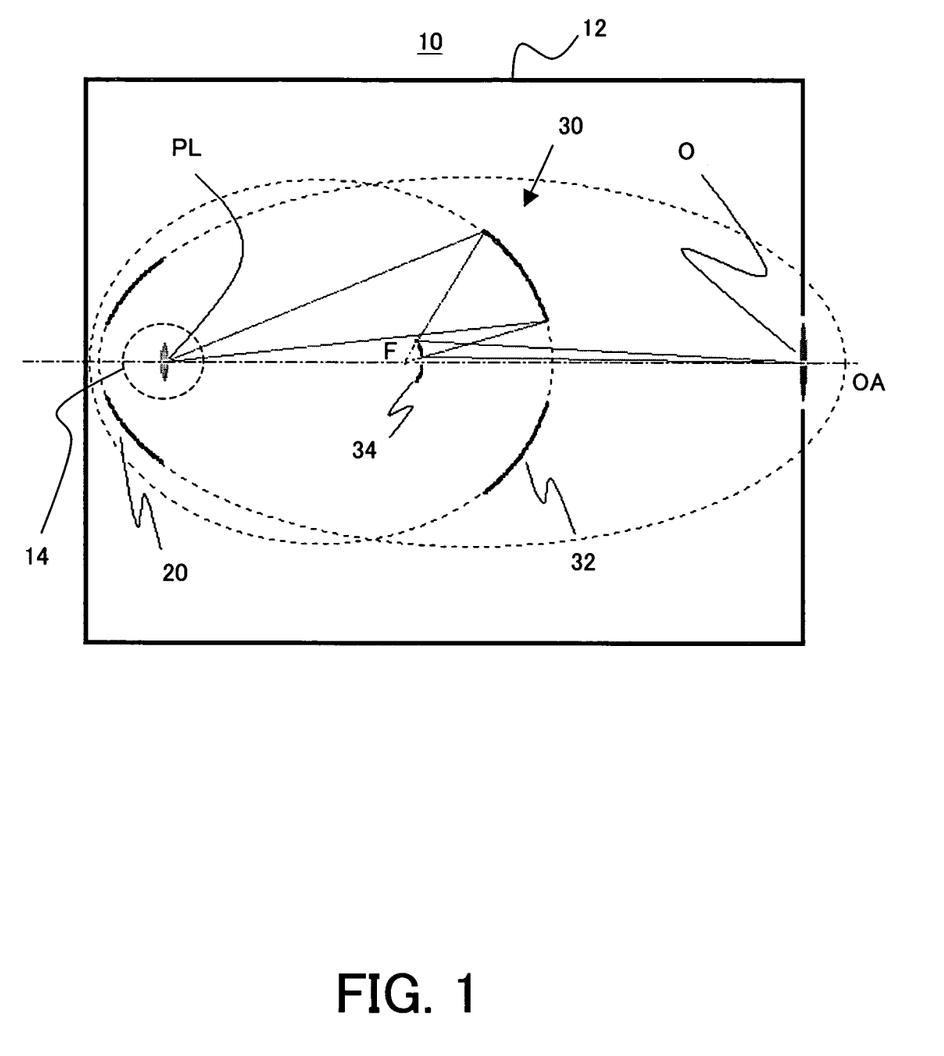
FIG. 1 is a schematic sectional view of an X-ray generator (EUV light source) according to one aspect of the present invention.

Referring now to the accompanying drawings, a description will be given of an X-ray generator (EUV light source) 10 according to this embodiment. Here, FIG. 1 is a partial section of the EUV light source 10. The EUV light source 10 includes, in a vacuum chamber 12, a plasma generating means that is not shown in FIG. 1 and will be described later, a debris mitigation system 14, and first and second optical systems 20 and 30 that introduce the EUV light through different optical paths. Thus, the EUV light source 10 has plural optical systems, makes uniform the angular distribution, and increases the light intensity of the light source.

The first optical system 20 is a condenser optical system that includes a spheroid mirror and condenses the X-ray (or EUV light) generated from the plasma generating point PL. One of the focal points of the first optical system 20 is the plasma generating point PL, and the other is the light source outlet O. A light that connects a center of the plasma generating point PL to a center of the light source outlet O corresponds to the optical axis OA. The acceptable solid angle is determined by the debris mitigation system 14 and the downstream optical system.

The second optical system 30 is an optical system that enhances the light intensity of the light source outlet O and the angular distribution uniformity. More specifically, the second optical system 30 supplements the light intensity and the angular distribution of the EUV light at the light source outlet O corresponding to the angular range shielded by the debris mitigation system 14. The second optical system 30 includes a spheroid mirror 32 and a hyperboloid mirror 34. The number of reflections is once in the first optical system 20, whereas the number of reflections is twice in the second optical system 30. Therefore, the number of reflections is different between these optical systems. One of the focal points of the second optical system 30 is also the plasma generating point PL, and the other is also the light source outlet O. More specifically, the spheroid mirror 32 has one focal point at the plasma emitting point PL, and the other focal point F on the optical axis. The hyperboloid mirror 34 has the focus points at both the plasma emitting point PL and the light source outlet O. Thus, the first and second optical systems 20 and 30 have approximately the same condensing point, where a phrase "approximately the same" intends to cover tolerance. The second optical system 30 is arranged at a position that does not shield the first optical system 20.

This embodiment assumes that the plasma emitting point PL uniformly distributes on the focal plane, and the EUV light emits isotropically from each location. It also assumes that the first optical system 20 ideally images, at an image point or the light source outlet O, the plasma emitting point PL of the object point. Therefore, the image uniformly circularly distributes at the image position, and the angular distribution of the EUV light does not depend upon the location. The reflectance of the first optical system 20 is set to R.

From the above assumptions, the brightness at the light source outlet O is expressed by IR [W/mm$^2$/sr/nm] irrespective of the capturing optical system, where I [W/mm$^2$/sr/nm] is the brightness of the emission at the plasma emitting point PL. Since an image has a fixed size S at the light source outlet O captured by the optical system downstream from the light source, the light intensity per solid angle at the light source outlet O is IRS [W/sr/nm]. Therefore, a difference of the light intensity per solid angle at the light source outlet O is only the reflectance.

Figure 2:
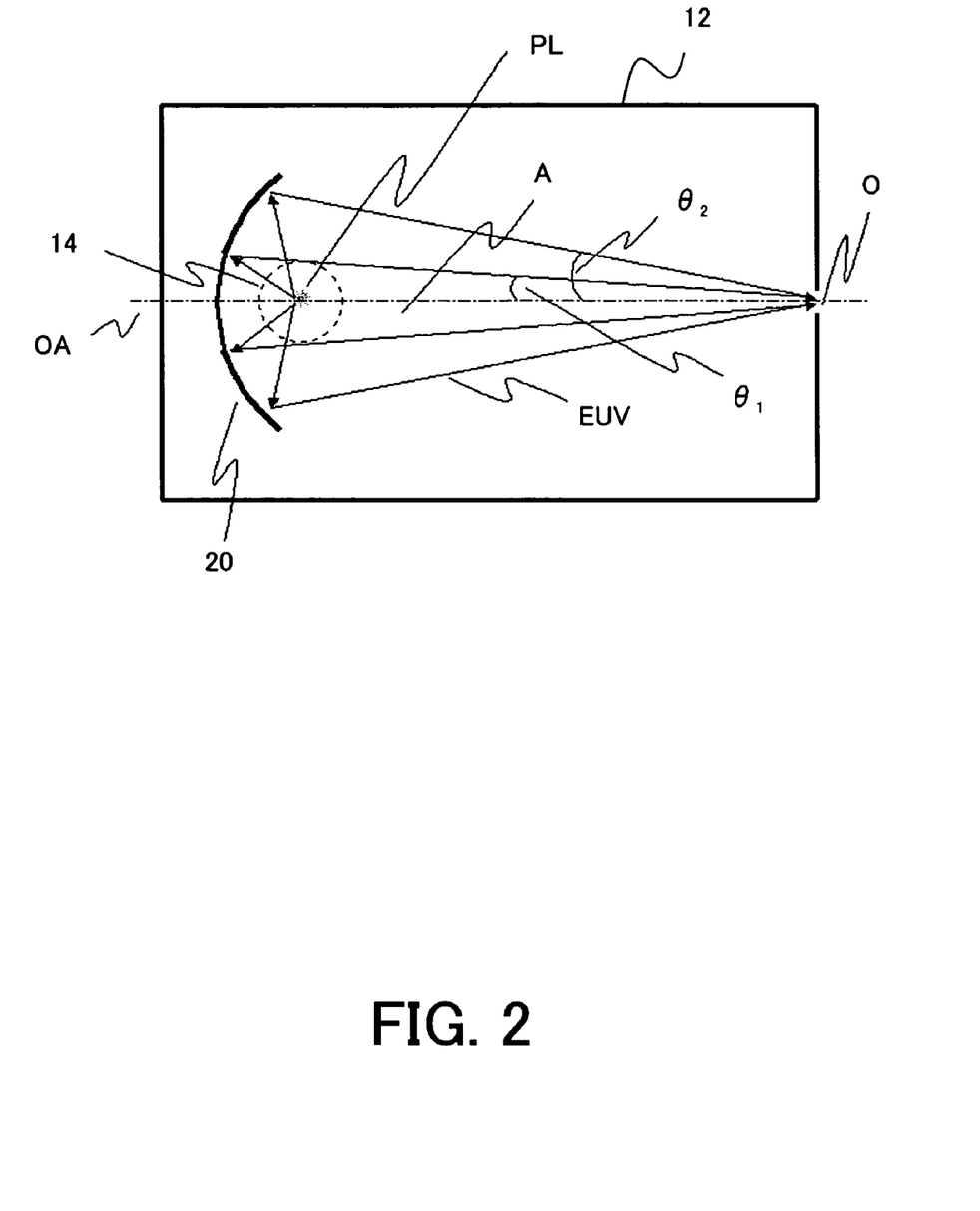
FIG. 2 is a schematic sectional view for explaining a problem when the EUV light source shown in FIG. 1 uses only a first optical system.

If there is only the first optical system 20, the debris mitigation system 14 shields the light and forms an area A that does not include the reflected light, for example, as shown in FIG. 2. FIG. 3 is an angular distribution of the EUV light emitted from the light source. E1 is the energy captured by the first optical system 20. However, when the second optical system 30 is properly designed and its reflectance is set to R', the angular distribution can be corrected as shown in FIG. 4. In FIG. 4, E1 is the energy captured by the first optical system 20, and E2 is the energy captured by the second optical system 30. In FIG. 4, E1 denotes the light intensity distribution similar to that in FIG. 3, and the light intensity distribution E2 is extended by an angular zone from $\theta_0$ to $\theta_1$. Thereby, the light intensity increases, the throughput increases, and the more uniform angular distribution in the range from $\theta_0$ to $\theta_2$ improves the imaging characteristic.

The capturing amount of the EUV light is expressed by a product (or etendue) between the solid angle and the size. The etendue [mm$^2$·sr] is defined as (solid angle captured by the optical system)×size. The etendue of 1 or smaller is preferable for exposure of a size of 100 nm or smaller.

First Embodiment

Figure 5:
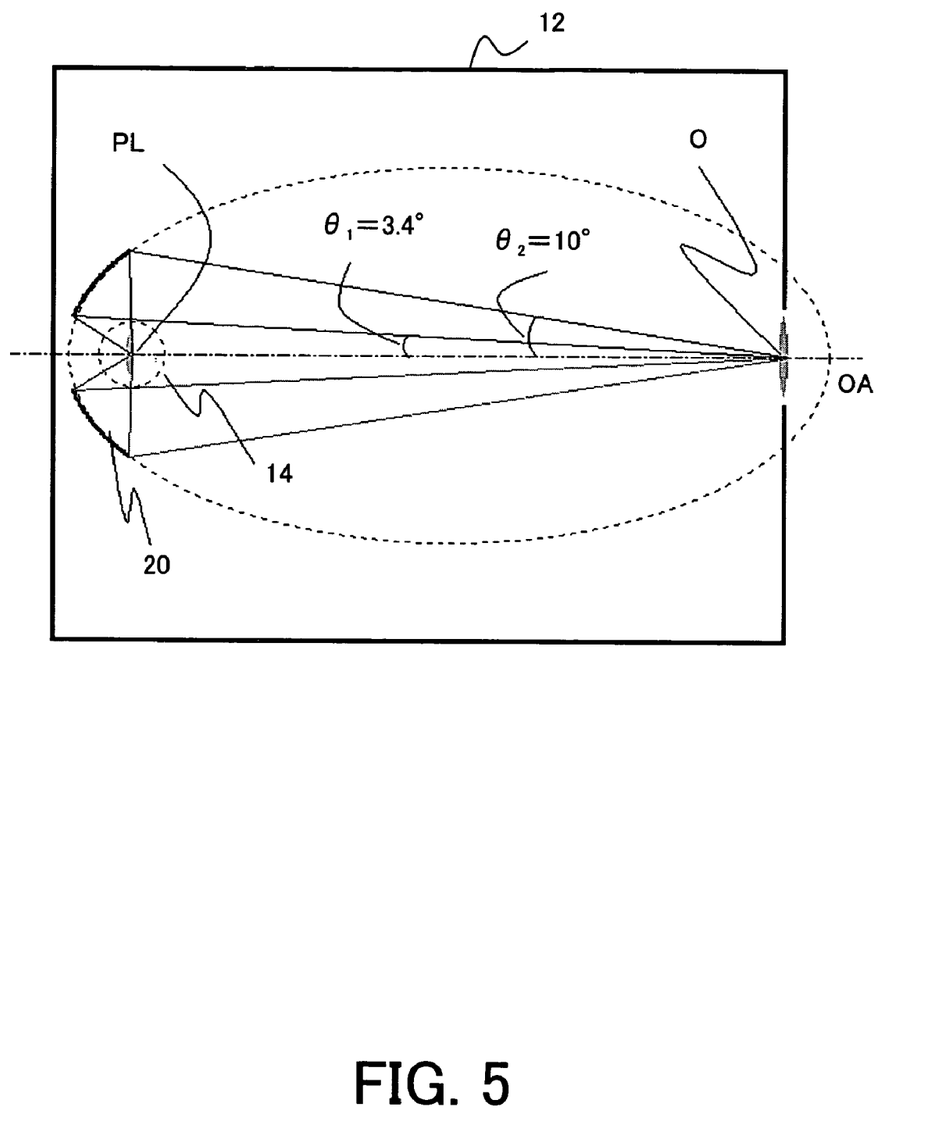
FIG. 5 is a schematic sectional view of one embodiment of the structure shown in FIG. 2.

A description will now be given of the concrete structure of FIG. 1. First, as shown in FIG. 5, in the state where only the first optical system 20 exists, the plasma emitting point PL uniformly distributes in a circle with Φ0.5 mm on the focal plane, and the plasma brightness of 50 [W/mm$^2$/sr/nm]. For example, it is assumed by taking the debris removing capability into account the debris mitigation system 14 disclosed in U.S. Pat. No. 6,359,969 has a size of Φ100 mm. The image has a size of 10 mm$^2$ and a solid angle of 0.1 sr (etendue=1[mm$^2$·sr]) as a result of capture by the optical system downstream from the light source. Table 1 shows parameters of the first optical system 20 determined in terms of the size of the plasma emitting point, the size of the debris mitigation system 14, and the etendue:

TABLE 1

FIRST OPTICAL SYSTEM (SPHEROID MIRROR) 20

| | |
|---|---|
| DISTANCE BETWEEN FOCAL POINTS | 1000 mm |
| LENGTH OF MAJOR AXIS | 1200 mm |
| LENGTH OF MINOR AXIS | 660 mm |
| ANGLE BETWEEN OPTICAL AXIS AND LIGHT INCIDENT UPON MIRROR | 90°-144° |
| SOLID ANGLE | 5 sr |
| ANGLE BETWEEN OPTICAL AXIS AND REFLECTED LIGHT | 3.4°-10° |
| SOLID ANGLE | 0.1 sr |

Figure 6:
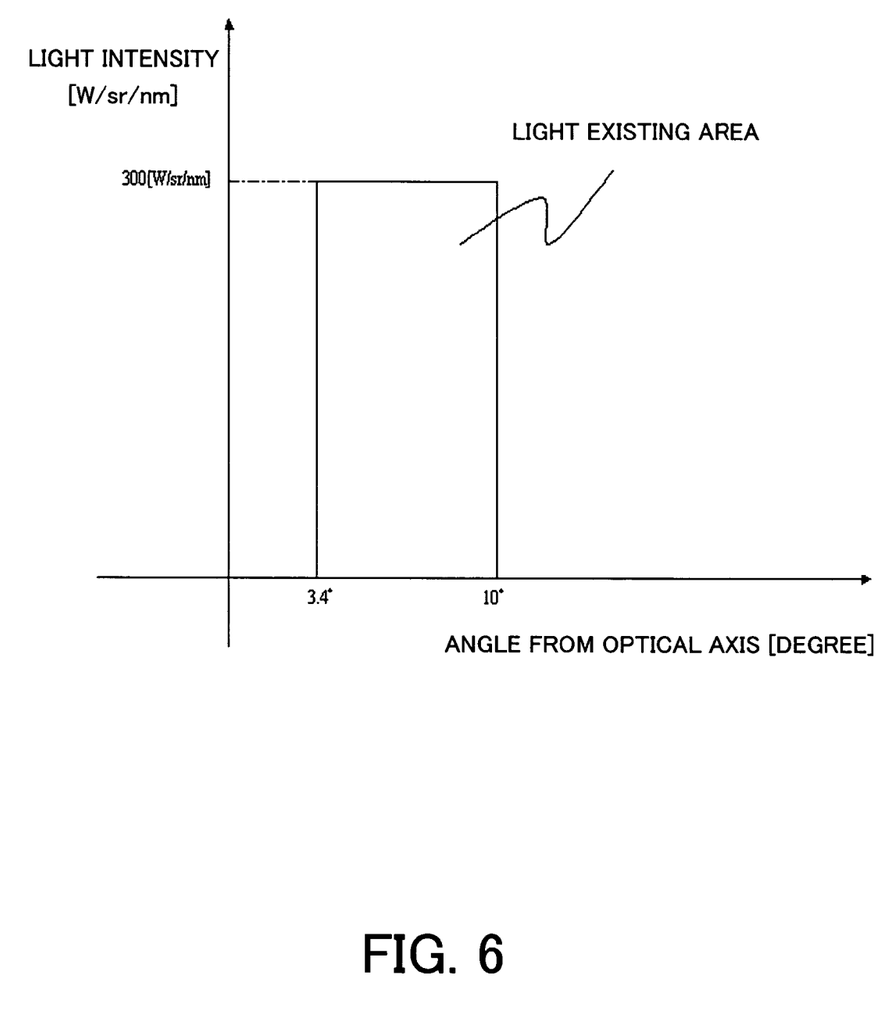
FIG. 6 is a view of a light intensity distribution at the light source outlet in the structure shown in FIG. 5.

As shown in FIG. 6, the angular distribution at the light source outlet has IRS=300 [W/sr/nm], $\theta_1$=3.4° and $\theta_2$=10° in FIG. 3. Therefore, no light exists due to shielding by the debris mitigation system 14 from 0° to 3.4° from the optical axis OA, and the light exists from 3.4° to 10°. The image at the light source outlet O has a size of about 10 mm$^2$, and a solid angle of 0.1 sr, and thus the etendue of about 1 [mm$^2$·sr]. The energy per unit solid angle of the EUV light emitted from the light source becomes 300 [W/sr/nm], where the reflectance of the mirror is 0.6. The total energy captured by the first optical system 20 and emitted from the light source is 300 [W/sr/nm]×0.1 [sr]=30 [W/nm].

Accordingly, the second optical system 30 is configured as shown in FIG. 1 by combining the spheroid mirror 32 and the hyperboloid mirror 34 so as to supplement the angular range between 0° and 3.4°. The EUV light emitted from the plasma emitting point PL is captured by the second optical system 30, and forms a light source image at the light source outlet. Table 2 shows one example of parameters of the second optical system 30.

TABLE 2

| | SECOND OPTICAL SYSTEM 30 | |
| --- | --- | --- |
| | SPHEROID MIRROR 32 | HYPERBOLOID MIRROR 34 |
| DISTANCE BETWEEN FOCAL POINTS | 370 mm | 630 mm |
| LENGTH OF MAJOR AXIS | 700 mm | |
| LENGTH OF MINOR AXIS | 660 mm | |
| DISTANCE BETWEEN APEXES | | 440 mm |
| ANGLE BETWEEN OPTICAL AXIS AND LIGHT INCIDENT UPON MIRROR | 7°-21° | |
| ANGLE BETWEEN OPTICAL AXIS AND REFLECTED LIGHT | | 0.75°-3.4° |
| SOLID ANGLE | 0.6 sr | 0.01 sr |

Figure 7:
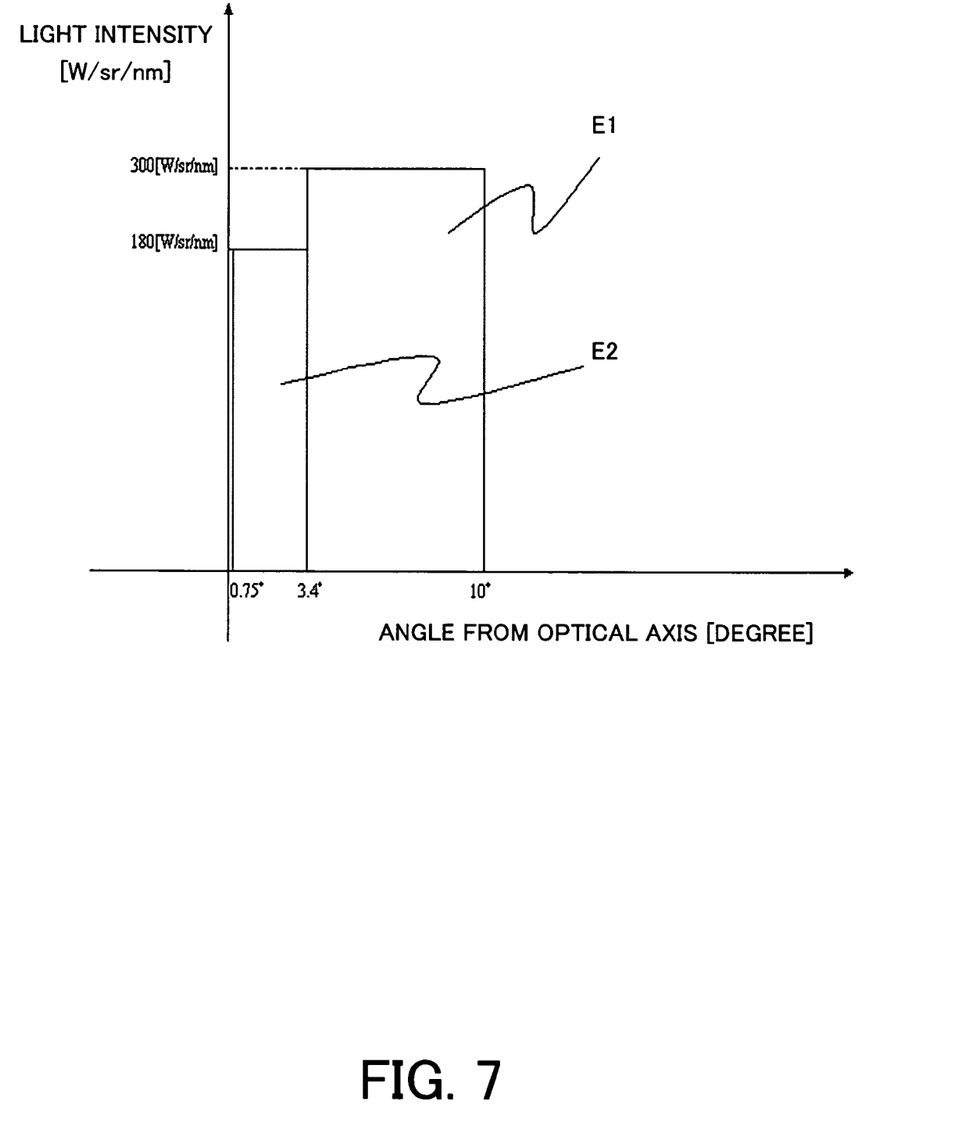
FIG. 7 is a view of a light intensity distribution near the light source outlet in one embodiment of the structure shown in FIG. 1.

Due to the second optical system 30, the light exists in the range between 0.75° and 3.4°, as shown in FIG. 7. The image at the light source outlet O by the second optical system 30 has a size of about 10 mm² and a solid angle of 0.01 sr. Thus, the energy per unit solid angle of the EUV light emitted from the light source becomes 180 [W/sr/nm], where the reflectance of each of the spheroid and hyperboloid mirrors 32 and 34 is 0.6. The total energy captured by the second optical system and emitted from the light source is 180 [W/sr/nm]×0.01 [sr]=1.8 [W/nm]. This corresponds to $\theta_0=0.75$ and IR'S=180 in FIG. 4.

As a result of that the first and second optical systems 20 and 30 are simultaneously used, the angular distribution of the energy per unit solid angle is as shown in FIG. 7, and the uneven angular distribution is corrected. The increasing rate of the total energy is 1.8 [W/nm]/30 [W/nm]=0.06, and the light intensity increases by about 6%.

While the illustrative parameters of the second optical system 30 are shown in the table, the number of configurations of the second optical system 30 is not one even if it combines the spheroid mirror 32 and the hyperboloid 34. The image to be captured by the downstream illumination optical system has a size of 10 mm² and a solid angle of 0.01 sr from 0° to 3.4°. Therefore, the maximum etendue that can be captured by the second optical system 30 and fed to the following optical system is 100 [mm²]×0.01 sr=0.1 [mm²·sr]. The second optical system may have an arbitrary configuration as long as it captures the etendue of 0.1 [mm²·sr] or greater from the plasma, and supplements the angular distribution between 0° and 3.4°.

Figure 8:
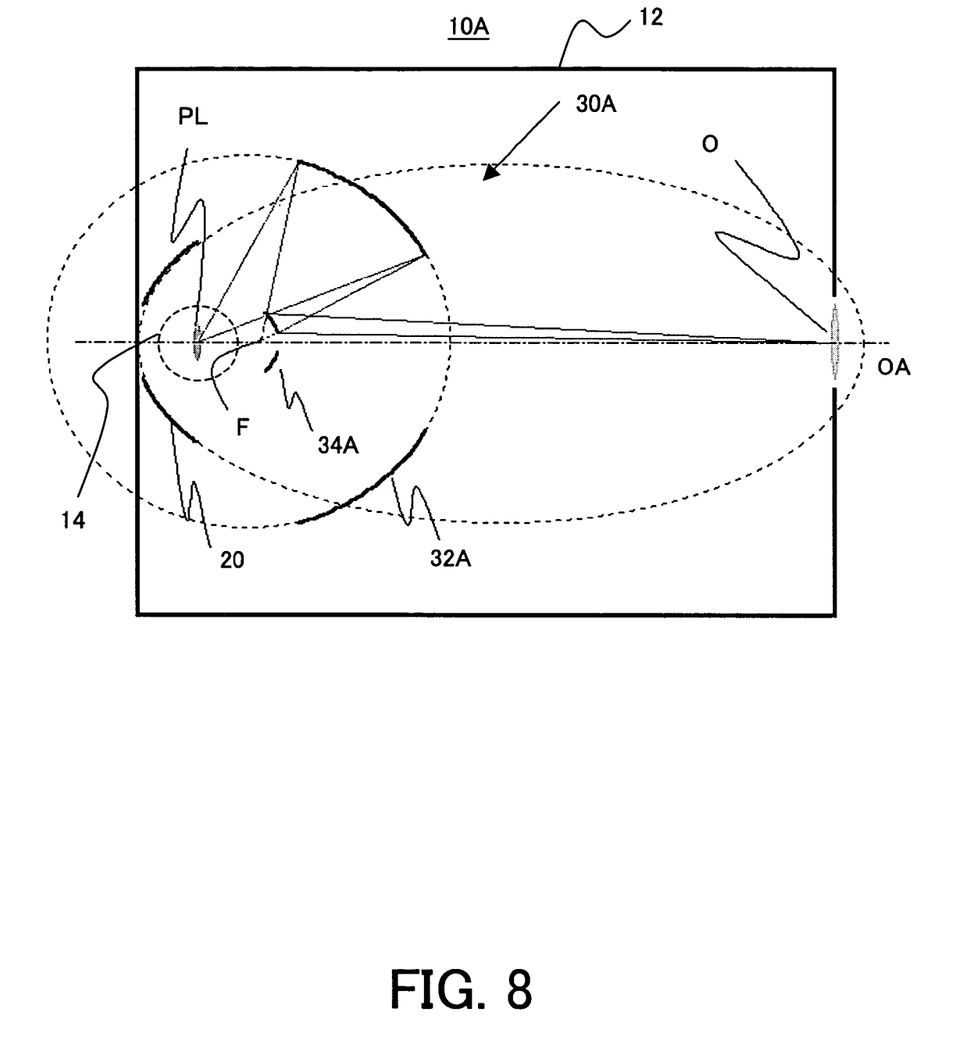
FIG. 8 is a schematic sectional view of an EUV light source as a variation according to the first embodiment of the present invention.

For example, the EUV light source 10A having a second optical system 30A having a configuration shown in FIG. 8 has the same effect. Table 3 shows parameters of the second optical system 30A.

TABLE 3

| | SECOND OPTICAL SYSTEM 30A | |
| --- | --- | --- |
| | SPHEROID MIRROR 32A | HYPERBOLOID MIRROR 34A |
| DISTANCE BETWEEN FOCAL POINTS | 100 mm | 630 mm |
| LENGTH OF MAJOR AXIS | 700 mm | |
| LENGTH OF MINOR AXIS | 690 mm | |
| DISTANCE BETWEEN APEXES | | 440 mm |
| ANGLE BETWEEN OPTICAL AXIS AND LIGHT INCIDENT UPON MIRROR | 24°-24° | |
| ANGLE BETWEEN OPTICAL AXIS AND REFLECTED LIGHT | | 0.75°-3.4° |
| SOLID ANGLE | 3 sr | 0.01 sr |

Second Embodiment

Figure 9:
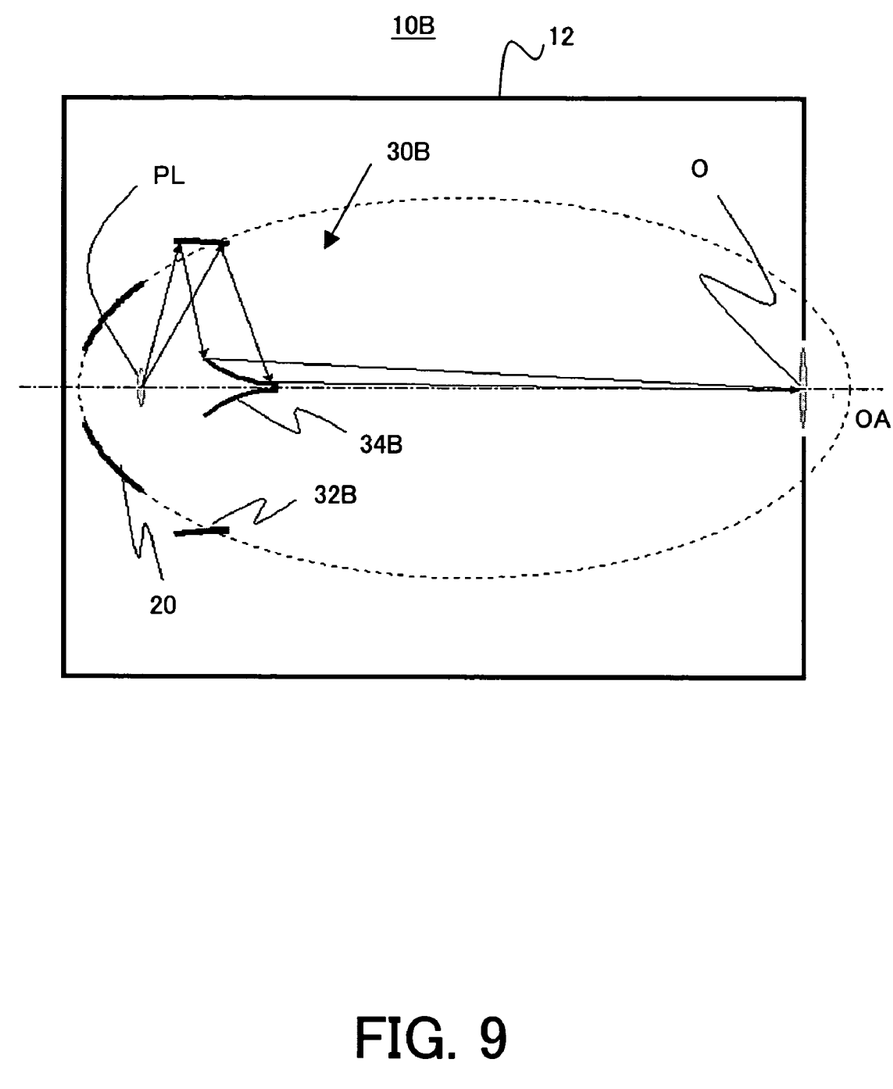
FIG. 9 is a schematic sectional view of an EUV light source according to a second embodiment of the present invention.

Alternatively, an EUV light source 10B having a second optical system 30B that includes a plane mirror 32B and a mirror 34B having a curvature may be used. The focal point of the second optical system 30B accords with two focal points of the first optical system 20, i.e., the plasma emitting point PL and the light source outlet O. The mirrors 32B and 34B in the second optical system 30 do not have a revolving body, but preferably have a rotational symmetry with respect to the optical axis. The number of reflections of the second optical system 30B is not limited to twice, but the smaller number of reflections is preferable when the energy attenuation due to the reflection is considered. This embodiment is similar to the first embodiment in that the second optical system 30B does not shield the optical path of the first optical system 20.

Third Embodiment

The second optical system 30 may include plural mirrors each having a curvature. The focal points of the second optical system 30 accord with the two focal points of the first optical system 20, i.e., the plasma emitting point PL and the light source outlet O. The number of reflections of the second optical system is not limited to twice, but the smaller number of reflections is preferable when the energy attenuation due to the reflection is considered. This embodiment is similar to the first embodiment in that the second optical system 30 does not shield the optical path of the first optical system 20.

Fourth Embodiment

Figure 10:
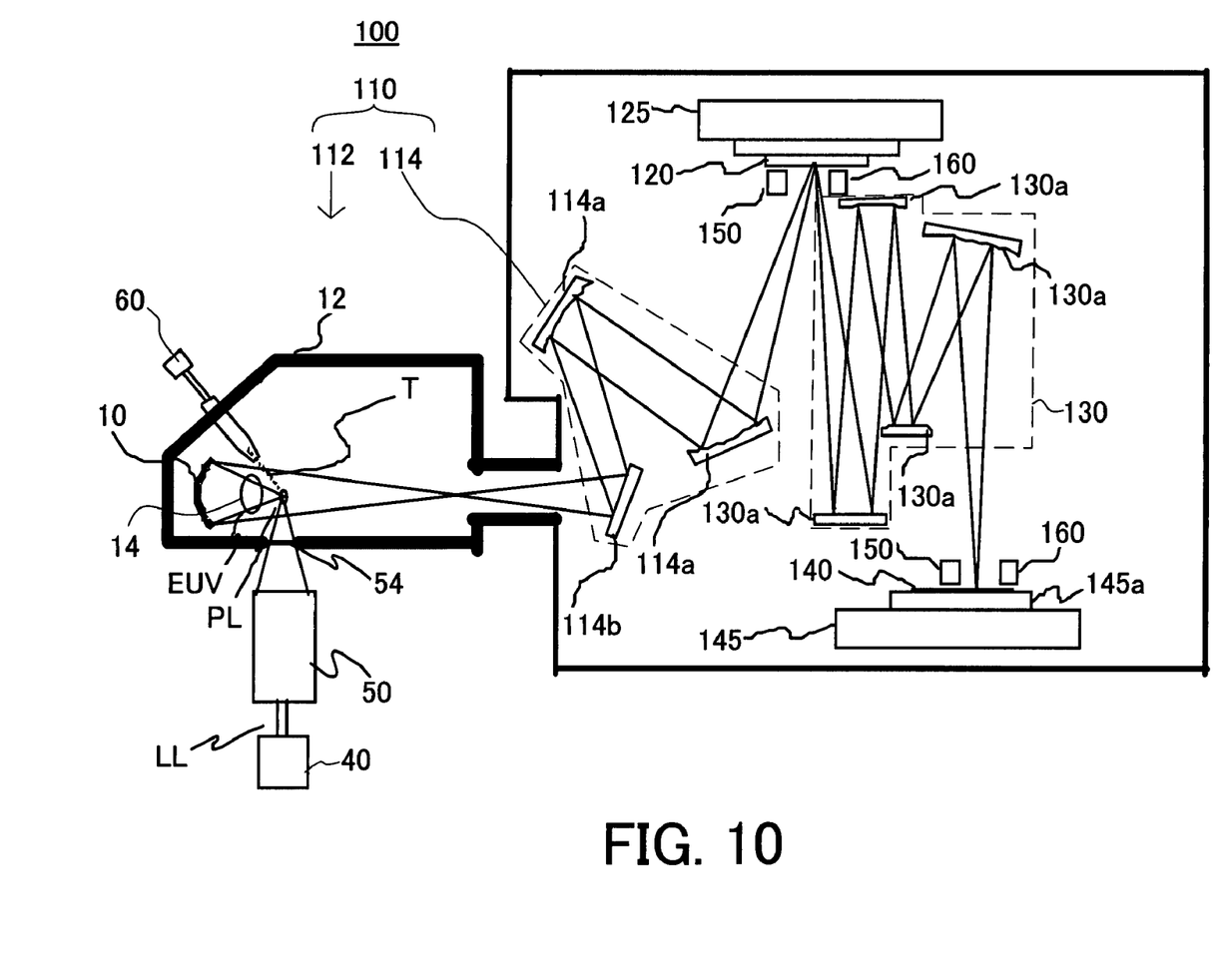
FIG. 10 is a schematic block diagram of an exposure apparatus according to one aspect of the present invention.

Referring now to FIG. 10, a description will be given of the X-ray generator that has a debris mitigation system of this embodiment and the exposure apparatus 100 having the same. Here, FIG. 10 is a schematic block diagram of a structure of the exposure apparatus 100.

The inventive exposure apparatus 100 is a projection exposure apparatus that exposes a circuit pattern of a reticle 120 onto an object 140 using the EUV light with a wavelength of 13.4 nm as exposure light in a step-and-scan or step-and-repeat manner. This exposure apparatus is suitable for a lithography process less than submicron or quarter micron, and the present embodiment uses the step-and-scan exposure apparatus (also referred to as a "scanner") as an example. The "step-and-scan", as used herein, is an exposure method that exposes a reticle pattern onto a wafer by continuously scanning the wafer relative to the reticle, and by moving, after a shot of exposure, the wafer stepwise to the next exposure area to be shot. The "step-and-repeat" is another mode of exposure method that moves a wafer stepwise to an exposure area for the next shot every shot of cell projection onto the wafer.

The exposure apparatus 100 includes an illumination apparatus 110, a reticle stage 125 that supports and mounts the reticle 120, a projection optical system 130, a wafer stage 145 that supports and mounts the object 140 to be exposed, an alignment detecting mechanism 150, and a focus position detecting mechanism 160.

The illumination apparatus 110 uses arc-shaped EUV light, for example, with a wavelength of 13.4 nm corresponding to an arc-shaped field of the projection optical system 130 to illuminate the reticle 120, and includes an EUV light source 112 and illumination optical system 114.

The EUV light source 112 according to this embodiment is a laser plasma light source that irradiates a laser beam LL to a target T, and generates plasma and the EUV light EL radiated from the plasma. The EUV light source 112 may apply any one of the above EUV light sources 10 to 10B. The EUV light source 112 includes a laser light source part 40 that irradiates the laser beam LL, an optical system 50 that introduces the laser beam LL to the target T, and a target supply unit 60, in addition to the above structure of the EUV light source 10. FIG. 10 omits a detailed configuration of the EUV light source 10 for illustration purposes.

The laser beam LL emitted from the laser light source part is condensed by the optical system 50, and irradiated onto the target T. The target T may include copper, tin, aluminum and other metal materials, or Xe gas, droplets and cluster. For example, the target T is intermittently supplied as Xe droplets from the target supply unit 60 in synchronization with the emissions of the laser beam LL of the laser light source part 40. The energy from the laser beam LL generates the high-temperature and high-density plasma from the target T, and emits the EUV light from the plasma 1. The EUV light is collected by the first optical system 10, and supplied to the following illumination optical system 114.

The optical system 50 includes a lens, a mirror, a plane-parallel plate glass, etc., and serves as part of the vacuum diaphragm of the vacuum chamber 12. A laser introduction window 54 that transmits the laser beam LL to the vacuum chamber 12 is part of the optical system 50. The optical system 50 adjusts the laser beam LL for efficient acquisitions of the EUV light so that its spot size and energy density on the target T is necessary and sufficient to generate the plasma.

The plasma also generates the debris in addition to the EUV light, which originates from the target T, copper, and target supply unit 60. The generated debris gradually adheres to and deposits on the first optical system 10, lowering the light intensity. Accordingly, the debris mitigation system 14 is arranged between the plasma emitting point PL and the first optical system 10. In addition, the second optical system 30 omitted in FIG. 10 supplements the EUV light shielded by the debris mitigation system 14.

The illumination optical system 114 includes condenser mirrors 114a, and an optical integrator 114b. The condenser mirror 114a serves to collect the EUV light that is isotropically irradiated from the laser plasma. The optical integrator 114b serves to uniformly illuminate the reticle 120 with a predetermined numerical aperture ("NA"). An aperture to limit the illumination area to an arc shape is also provided. The illumination optical system 114 may use a multilayer mirror and an grazing angle total reflection mirror.

The reticle 120 is a reflection reticle that has a circuit pattern or image to be transferred, and supported and driven by the reticle stage 125. The diffracted light from the reticle 120 is reflected by the projection optical system 130 and projected onto the object 140. The reticle 120 and the object 140 are arranged in an optically conjugate relationship. The exposure apparatus 100 is a scanner, and projects a reduced size of the pattern of the reticle 120 onto the object 140 by scanning the reticle 120 and the object 140.

The reticle stage 125 supports the reticle 120 and is connected to a moving mechanism (not shown). The reticle stage 125 may use any structure known in the art. A moving mechanism (not shown) may include a linear motor etc., and drives the reticle stage 125 at least in a direction X and moves the reticle 120. The exposure apparatus 100 synchronously scans the reticle 120 and the object 140.

The projection optical system 130 uses plural multilayer mirrors 130a to project a reduced size of a pattern of the reticle 120 onto the object 140. The number of mirrors 130a is about four to six. For wide exposure area with the small number of mirrors, the reticle 120 and object 140 are simultaneously scanned to transfer a wide area that is an arc-shaped area or ring field apart from the optical axis by a predetermined distance. The projection optical system 130 has a NA of about 0.2 to 0.3.

The instant embodiment uses a wafer for the object 140, but it may include a spherical semiconductor and liquid crystal plate and a wide range of other objects to be exposed. Photoresist is applied onto the object 140.

The object 140 is held onto the wafer stage 145 by a wafer chuck 145a. The wafer stage 145 moves the object 140, for example, using a linear motor in XYZ directions. The reticle 120 and the object 140 are synchronously scanned. The positions of the reticle stage 125 and wafer stage 145 are monitored, for example, by a laser interferometer, and driven at a constant speed ratio.

The aligment detection system 150 measures a positional relationship between the position of the reticle 120 and the optical axis of the projection optical system 130, and a positional relationship between the position of the object 140 and the optical axis of the projection optical system 130, and sets positions and angles of the reticle stage 125 and the wafer stage 145 so that a projected image of the reticle 120 may be positioned in place on the object 140.

A focus detection optical system 160 measures a focus position on the object 140 surface, and control over a position and angle of the wafer stage 145 may always maintain the object 140 surface at an imaging position of the projection optical system 130 during exposure.

In exposure, the EUV light emitted from the illumination apparatus 110 illuminates the reticle 120, and images a pattern of the reticle 120 onto the object 140 surface. The instant embodiment uses an arc or ring shaped image plane, scans the reticle 120 and object 140 at a speed ratio corresponding to a reduction ratio to expose the entire surface of the reticle 120. The EUV light source 112 in the illumination apparatus 110 used for the exposure apparatus 100 improves the light intensity and the angular distribution of the exposure light, sufficiently removes the debris, and stably generates the EUV light. Thus, the exposure apparatus 100 may manufacture devices (such as a semiconductor device, a LCD device, an image-taking device (such as a CCD), and a thin-film magnetic head) with good economical efficiency and throughput.

Figure 11:
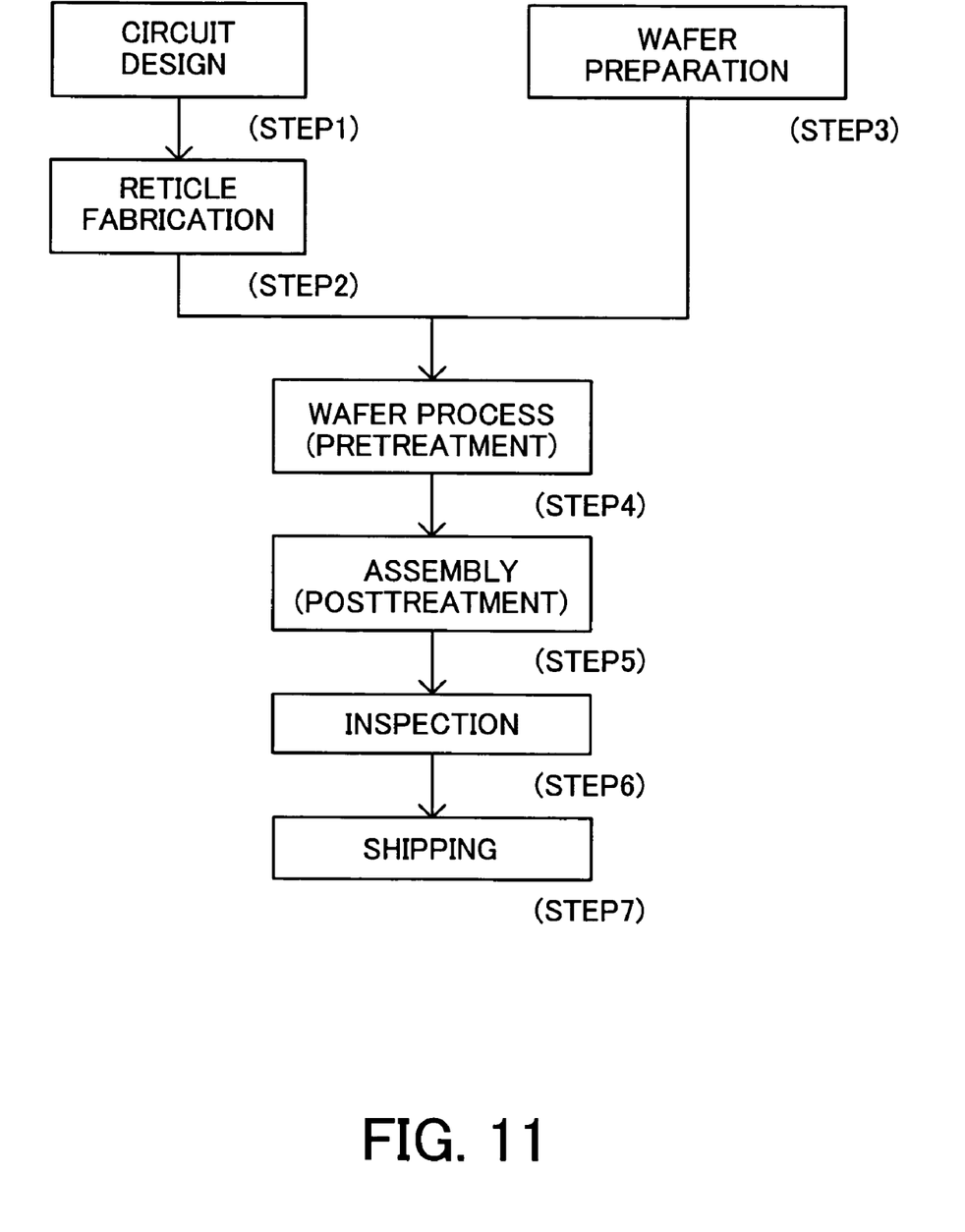
FIG. 11 is a flowchart for explaining manufacture of devices (such as semiconductor chips such as ICs and LCDs, CCDs, and the like).
Figure 12:
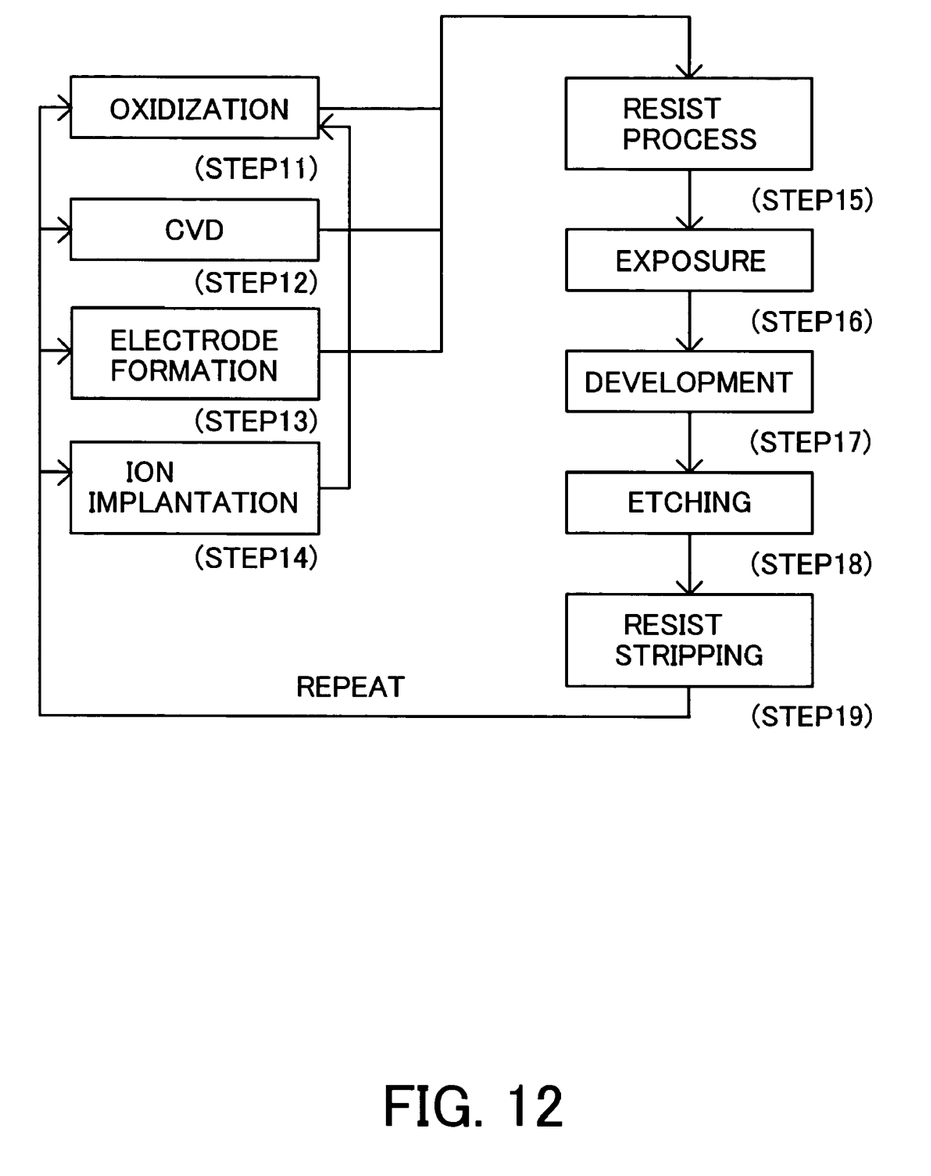
FIG. 12 is a detail flowchart of a wafer process as Step 4 shown in FIG. 11.

Referring now to FIGS. 11 and 12, a description will be given of an embodiment of a device manufacturing method using the above exposure apparatus 100. FIG. 11 is a flowchart for explaining manufacture of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (reticle fabrication) forms a reticle having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 12 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 100 to expose a circuit pattern of the reticle onto the wafer. Step 17 (development) develops the exposed wafer. Step 18 (etching) etches parts other than a developed resist image. Step 19 (resist stripping) removes the disused resist after etching. These steps are repeated, and multilayer circuit patterns are formed on the wafer. The device manufacturing method of this embodiment may manufacture a higher quality device than the conventional method. The device fabrication method that uses the exposure apparatus 100 and the resultant devices also constitute one aspect of the present invention.

Further, the present invention is not limited to these preferred embodiments, and various variations and modifications may be made without departing from the scope of the present invention.

This application claims a benefit of priority based on Japanese Patent Application No. 2004-295625, filed on Oct. 8, 2004, which is hereby incorporated by reference herein in its entirety as if fully set forth herein.

What is claimed is:

1. An X-ray generator for generating plasma and X-ray emitted from the plasma, said X-ray generator comprising: a unit for generating the plasma; and plural reflection optical systems for introducing the X-ray through different optical paths, said plural reflection optical systems include: a first reflection optical system that includes a spheroid mirror; a second reflection optical system that includes a spheroid mirror and a hyperboloid mirror that are arranged at plural positions so that the spheroid and hyperboloid mirrors have rotational symmetry; and a third reflection optical system that includes a spheroid mirror and a hyperboloid mirror that are arranged at plural positions so that the spheroid and hyperboloid mirrors have rotational symmetry.

2. An X-ray generator for generating plasma and X-ray emitted from the plasma, said X-ray generator comprising: a unit for generating the plasma; and plural reflection optical systems for introducing the X-ray through different optical paths, said plural reflection optical systems include: a first reflection optical system that includes a spheroid mirror; and a second reflection optical system that includes a plane mirror and a mirror having a curvature.

* * * * *